United States Patent
Gao

(10) Patent No.: US 11,116,103 B2
(45) Date of Patent: Sep. 7, 2021

(54) MULTI-FLOOR DATA CENTER COOLING SYSTEM

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 92 days.

(21) Appl. No.: 16/710,121

(22) Filed: Dec. 11, 2019

(65) Prior Publication Data

US 2021/0185847 A1 Jun. 17, 2021

(51) Int. Cl.
*H05K 7/14* (2006.01)
*H05K 7/20* (2006.01)

(52) U.S. Cl.
CPC ......... *H05K 7/1487* (2013.01); *H05K 7/1492* (2013.01); *H05K 7/208* (2013.01); *H05K 7/20145* (2013.01); *H05K 7/20309* (2013.01); *H05K 7/20718* (2013.01)

(58) Field of Classification Search
None
See application file for complete search history.

(56) References Cited

U.S. PATENT DOCUMENTS

| | | | |
|---|---|---|---|
| 2009/0229784 A1* | 9/2009 | Rohr | H05K 7/20836 165/11.1 |
| 2013/0098086 A1* | 4/2013 | Sillato | F25B 49/02 62/184 |
| 2016/0330873 A1* | 11/2016 | Farshchian | H05K 7/20809 |
| 2016/0363359 A1* | 12/2016 | Lin | F25B 41/00 |
| 2017/0122633 A1* | 5/2017 | Riddle | H05K 7/20827 |
| 2017/0231118 A1* | 8/2017 | Cader | H05K 7/20381 |
| 2017/0280593 A1* | 9/2017 | Magallanes | H05K 7/20754 |
| 2018/0168071 A1* | 6/2018 | Edge | H05K 7/20145 |
| 2018/0279509 A1* | 9/2018 | Leckelt | H05K 7/20827 |
| 2019/0373776 A1* | 12/2019 | Gao | H05K 7/20781 |
| 2021/0084796 A1* | 3/2021 | Gao | H05K 7/2079 |

* cited by examiner

*Primary Examiner* — Xanthia C Cunningham
(74) *Attorney, Agent, or Firm* — Womble Bond Dickinson (US) LLP

(57) ABSTRACT

A multi-floor data center can include a data center building having a plurality of floors, a single centralized air intake module spanning each of the plurality of floors, a number of cooling coil modules, a centralized liquid cooling system, and a number of IT modules. Each of the floors includes at least one of the cooling coil modules configured to receive external air from the single air intake module to cool a cooling coil. The centralized liquid cooling system is configured to circulate cooling liquid to the cooling coil for each of the cooling coil modules. Each of the floors includes one of the IT modules configured to house computing systems, and internal air is cooled at each of the cooling coil modules and introduced into each of the IT modules to cool the computing systems. Each floor can be equipped with different modular cooling systems with different cooling capacities.

20 Claims, 6 Drawing Sheets

MULTI-FLOOR DATA CENTER COOLING SYSTEM

FIELD OF THE DISCLOSURE

Embodiments of the present invention relate generally to data centers. More particularly, embodiments of the invention relate to cooling systems for multi-floor data centers.

BACKGROUND

Data centers are mission critical facilities which are used for housing IT equipment and servers. The variation in business requirements and use cases, variation in computing power requirements, etc. cause significant variation in IT equipment design. The variations in the IT design include the variation in different type of server management solutions. The cooling system for such data centers is critical and raises a number of non-trivial challenges.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
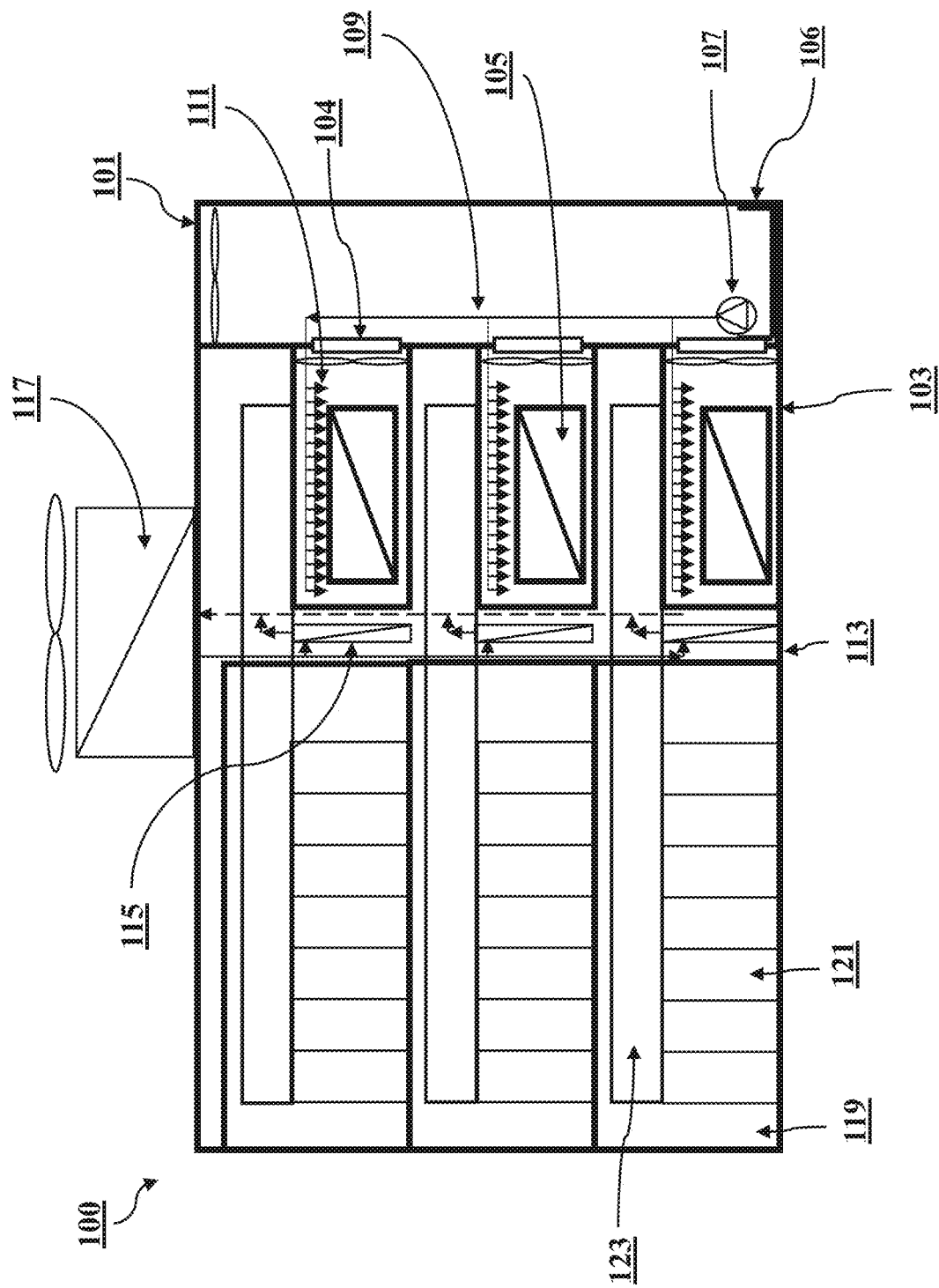
FIG. 1 shows a schematic representation of a building architecture for a multi-floor data center, according to an embodiment of the present disclosure.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In the description of the embodiments provided herein, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other. Additionally, the terms "server," "client," and "device" are intended to refer generally to data processing systems rather than specifically to a particular form factor for the server, client, and/or device.

Embodiments described herein provide for a cooling system for a multi-floor data center that is implemented on the building level design. The many variations in IT equipment housed in data centers brings challenges to the data center cooling infrastructure design, since it needs to support the IT development and operation. One of the current challenges for data center design is that it needs to take high flexibility and availability requirements, as well as many other factors, into consideration. For cloud service providers, this is a key challenge since seemingly insignificant differences in customer requirements may result in large dynamic variations in the IT equipment and hardware platforms, including the power density, cooling methods, cooling requirements, etc. In some cases, a data center cooling system may be required to handle large variations in IT equipment in an efficient and cost effective way. Most cooling unit and cooling infrastructure are deployed before the IT equipment that will eventually populate the data center. In addition, the data center building and data center cooling system are often designed and built to last between 10-15 years. An additional problem faced in data centers is to eliminate the amount of space needed for the cooling system, especially for a multi-floor data center building. A multi-floor data center design is already based on a consideration of floor limitation, therefore the space for a cooling system may be very limited. The cooling system and infrastructures often occupy a large amount of floor space of a data center. As opposed to hyper-scale data centers which may house thousands of IT racks and are often located in areas where floor space and square footage is not a significant constraint, in multi-floor data centers it is desirable to reduce the amount of floor space dedicated to cooling systems. Therefore, a solution is needed for a data center design to flexibly handle these requirements, and one with a high availability for different types of IT deployment.

With the dynamic variations in IT equipment design, the deployment and operation of this IT hardware will bring more challenges on data centers and their power and cooling infrastructures. It is a challenge for data center owners and designers to continue to innovate the cooling infrastructures and power infrastructures as well as the building architecture to support these different dynamic variations and requirements.

In some embodiments, the site selection for a data center is a critical procedure which may significantly impact the data center total cost and long term operation. In addition, the data center site location impacts the data center architecture. For example, the corresponding site weather conditions and limitations on floor space impact the design and operation of the cooling infrastructure. Additional factors to evaluate for a data center building design can include, for example, the total cost of ownership including operational cost and capital cost, availability, reliability, modularity, space efficiency, flexibilities, deployment efficiency, etc.

In some embodiments, the design of data center considers the data center building design and the cooling infrastructure design/selection as a closed coupled procedure. A modular building design can provide an efficient designing method for data center building and cooling infrastructure, and may improve the data center deployment efficiency significantly.

According to one embodiment, a building level module design is disclosed which combines the cooling modes at a building level using a centralized design. By such a design, the various cooling modes (air to air dry mode, wet mode, and direct expansion (DX) mode) can function organically and can be adjusted independently. In some embodiments, the liquid system for the cooling systems on several or all of the floors of the multi-floor data center can be centralized, meaning that only one centralized liquid sump is needed for the entire building and for different liquid (e.g., water) usage purpose. This significantly reduces the cost of liquid system components and installation, maintenance, operation, etc. and also improves the reliability and serviceability of the liquid system.

In some embodiments, a direct expansion (DX) cooling system (also referred to as an enhanced cooling system) is decoupled as one individual module, enabling independent adjustment of the evaporator configuration and entire vapor compression loop. In some embodiments, the cooling coil is also designed as an independent module, enabling dynamic adjustment of cooling capacity based on current requirements. In some cases, this enables a cooling coil to be replaced or upgraded and serviced without interfering with the operation of any other modules on the same or different floors. Not only can the coil be individually replaced or changed, but also all the other system components and modules within the data center can potentially be individually serviced and replaced, in some embodiments.

In one embodiment, a building level design of a data center cooling system includes several modules, including an air intake module, a cooling coil module, an enhanced cooling module, and an IT module. In one example embodiment, the air intake module is the intake of external cooling air into the building, and this module can span all of the floors of the multi-floor data center. Within the air intake module, an important component can be the liquid system, and this first module can be the main cooling air source and liquid source for the entire data center building. This can be also understood as a centralized cooling source module. The centralized liquid system can be used for evaporative cooling for both the air to air cooling coil and the external cooling unit, such as a cooling tower, or other systems which require liquid, according to some embodiments.

The cooling coil module can include the air to air cooling coil, in some embodiments, as well as a corresponding air ducting system. In some embodiments, the cooling coil module can also include one or more spray nozzles for spraying liquid over the cooling coil during wet operation mode. For all floors of the data center the liquid can be supplied, in some embodiments, from the centralized liquid system discussed above. Louvers may be used at the inlet and exits of the module where the air inlet and outlet are located. The louvers may be assembled together with the air ducting system, in some embodiments.

The enhanced cooling module can include a vapor refrigeration cooling loop and evaporators to further cool air prior to introduction into the IT module, where the IT racks are housed. An air ducting system may be assembled for better airflow management into, out of, and/or through the enhanced cooling module.

In some embodiments, this modular approach provides one or more of the following advantages. The modular system disclosed herein provides a reduction in floor space required for cooling equipment, and a simplified cooling unit by integrating the liquid system across multiple floors. By using a centralized liquid system, individual cooling unit liquid loop for each floor, and the corresponding components, are eliminated. By using the independent enhanced cooling module, the individual DX system in the cooling unit can be eliminated. In some embodiments, condenser unit heat transfer area can be increased for better cooling performance. By adjusting the configurations of each of the different modules at different floors, the cooling capacities and cooling conditions can be adjusted and tailored. For example, the IT equipment power density may be different at different floors, and the IT equipment may be implemented with different cooling solutions, such as pure air cooling, liquid cooling or hybrid cooling, etc. While some floors may be designed for IT equipment, other floors may be designed or customized for power system and battery rooms (Uninterruptible Power Supply (UPS) battery modules). By imbedded cooling system and building infrastructure design, the deployment efficiency can be improved, especially for a compact edge data center.

System Overview

FIG. 1 shows a schematic representation of a building architecture for a multi-floor data center 100, according to an embodiment of the present disclosure. In this example embodiment, it can be seen that there are several modules used. The first module is the air intake module 101. In some embodiments, the external air is pulled into the building first, using an air intake module 101, before going into a cooling coil 105. Within the air intake module 101, the liquid system can be installed including a liquid sump or basin 106, a liquid pump 107, and liquid loop 109 (shown as solid lines). This can be considered as the building central liquid system for all the floors of the multi-floor data center 100. In this example embodiment, only one liquid pump 107 is used, although additional pumps may be used in other embodiments.

The second module in this example embodiment of the building infrastructure is the cooling coil module 103. In embodiment, the cooling coil module 103 includes the air to air cooling coils 105, together with a portion of the air ducting systems and liquid spraying nozzles 111. In this module, the ducting system can be designed in different configurations based on the building and data center air flow management configuration and air flow paths. An example of an airflow management system and air ducting system for the cooling coil module 103 is illustrated in more detail below in reference to FIG. 5. In some embodiments, air louvers 104 may be assembled or incorporated into a side wall or portion of the cooling coil module 103.

The third module is this example embodiment is the enhanced cooling module 113. In some embodiments, the enhanced cooling module 113 is optional and may only be needed under extreme weather conditions. In one example embodiment, the enhanced cooling module 113 includes a DX loop where the evaporator 115 is located in the building and the air cooled condenser 117 is located on the roof of the data center. One skilled in the art will understand that, in order to simplify the figures, the full refrigeration cycle loop is not presented in FIG. 1. In some embodiments, the evaporator 115 is used for cooling the data center air when the ambient conditions are not sufficient for cooling. Additional heat is extracted to the evaporator 115 causing refrigerant change phase to vapor. In this example embodiment, the liquid loop is illustrated in solid lines, while the vapor loop is shown in broken lines. Again, additional valves may be used for controlling the cooling condition among different floors, and sensors may be used for monitoring the system or in combination with control systems.

The fourth module in this example embodiment is the IT module 119, which is configured to house IT racks 121. In other embodiments, other types of equipment, such as Uninterruptible Power Supply (UPS) battery modules, can be housed within the IT module 119. In some embodiments, the major building design component of the IT module 119 is the return air duct 123. In some embodiments, the IT module 119 can be connected with the cooling coil module 103 and/or enhanced cooling module 113 directly. The data center internal air recirculation can be designed in different manners. For example, the hot exhaust air from the IT racks 121 within the IT module 119 can be returned to the cooling coil module 103 via return air ducts 123 to exchange heat with external air introduced from the air intake module 101. In some embodiments, when the enhanced cooling module 113 is not needed or not activated, a bypass air loop, which can be operated with air louvers, can direct the air from the cooling coil module 103 around the enhanced cooling module 113 and to the IT module 119 directly. When enhanced cooling is activated, the air ducting system together with the louvers can allow the air to pass through the evaporators 115 of the enhanced cooling module 113 before entering the IT module 119.

Figure 2:
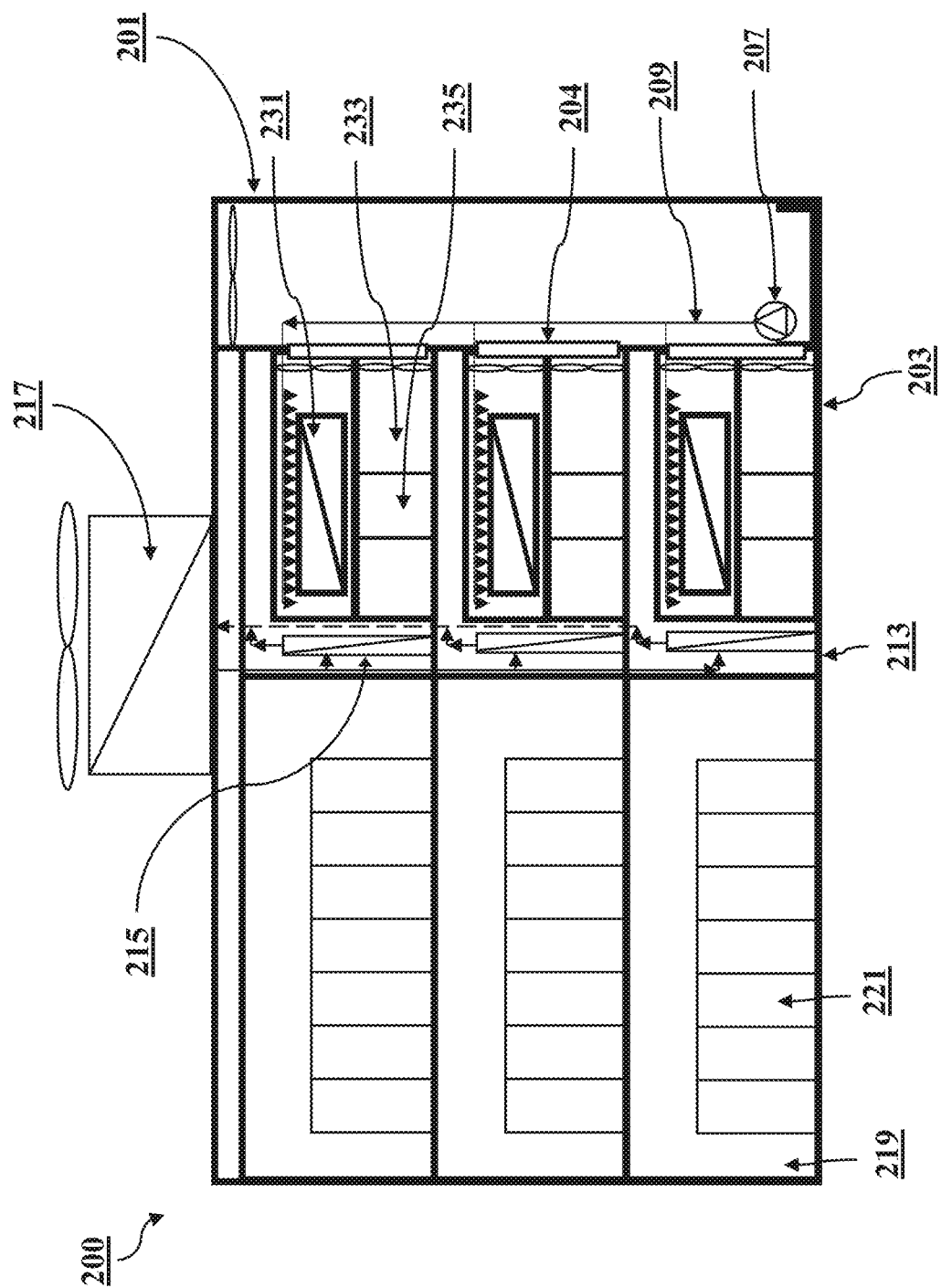
FIG. 2 shows another schematic representation of a building architecture for a multi-floor data center, according to an embodiment of the present disclosure.

FIG. 2 shows another schematic representation of a building architecture for a multi-floor data center 200, according to an embodiment of the present disclosure. This example embodiment presents a solution of a mixed direct free air cooling system and indirect free air cooling data center. Multiple cooling systems can be achieved by a combinational operation of different modules. Such a design enables the data center to be cooled using direct outside air if the air quality satisfies particular requirements, or to be cooled using an indirect cooling mode, or a mixture of the two, in combination with enhanced cooling, for different scenarios. For the indirect cooling operation, the details are presented in the previous paragraphs with respect to FIG. 1, and the indirect air cooling coils 231, which are in communication with the centralized liquid pump 207 and liquid loop 209. For the direct cooling operation, especially during days when the air is clean enough, the direct free air cooling loop is enabled. External air can be introduced or drawn in through the air intake module 201, which can operate with one or more fans or blowers located at the roof of the building, for example. In this example embodiment, the data center 200 also includes a cooling coil module 203 that is configured to house the direct cooling module 233 and/or the indirect air cooling coils 231. The direct cooling module 233 can include one or more fans or blowers to direct the external air from the air intake module 201 through a filter 235 prior to being introduced into the IT module 219 to cool the IT racks 221. In some embodiments, an enhanced cooling module 213 can also be included with evaporators 215 in communication with an air cooled condenser 217, as discussed above in reference to FIG. 1. The external air can be directed around the enhanced cooling module 213, in some embodiments, using a bypass duct and louvers, as also discussed in reference to FIG. 1. Once the external air has been passed through the IT module 219, it can exit the data center building as exhaust. In some embodiments, air louvers 204 may be assembled or incorporated into a side wall or portion of the cooling coil module 203 to direct air into or around the direct cooling module 233 and/or the indirect air cooling coils.

The example embodiment shown in FIG. 2 allows for increased flexibility since each floor of the multi-floor data center can be cooled using direct free air cooling, indirect air cooling, or a combination of the two. As will be appreciated, when indirect air cooling is used, a return air duct (not shown) can be used to recirculate all or a portion of the air from the IT module 219 back to the cooling coil module 231.

Figure 3:
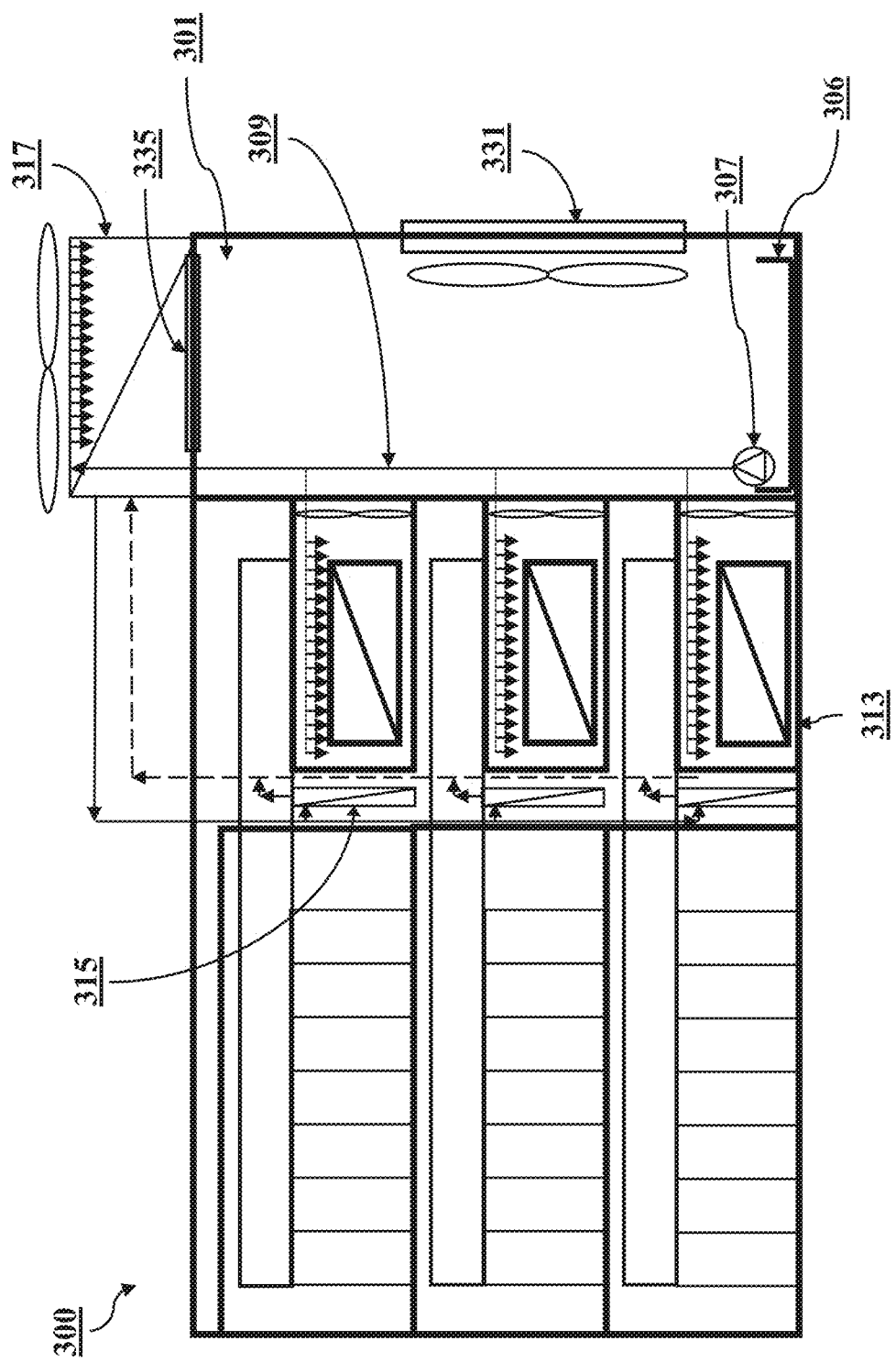
FIG. 3 shows another schematic representation of a building architecture for a multi-floor data center, according to an embodiment of the present disclosure.

FIG. 3 shows another schematic representation of a building architecture for a multi-floor data center 300, according to an embodiment of the present disclosure. In this example embodiment, the air intake module 301 is configured with an air intake device 331, such as a fan or blower, to intake air through the side of the building. In some embodiments, the external cooling unit or condenser 317 for the evaporators 315 can be located above the air intake module 301 such that a cooling air inlet 335 can connect the condenser 317 and the air intake module 301. In such a design, the centralized cooling air is used for both the cooling coil module 313 as well as the external condenser 317, if needed. In addition, the centralized liquid sump or basin 306, liquid pump 307, and liquid system loop 309 can be used for both the evaporative cooling for the cooling coils in the cooling coil module 313 as well as the external condenser 317. The liquid pump 306 can be installed within the air intake module 301 and can be the single source of liquid for the centralized liquid pump 307 and liquid system loop 309, in some embodiments. In such a design, the condenser 317 can be cooled with a lower cooling temperature.

Figure 4:
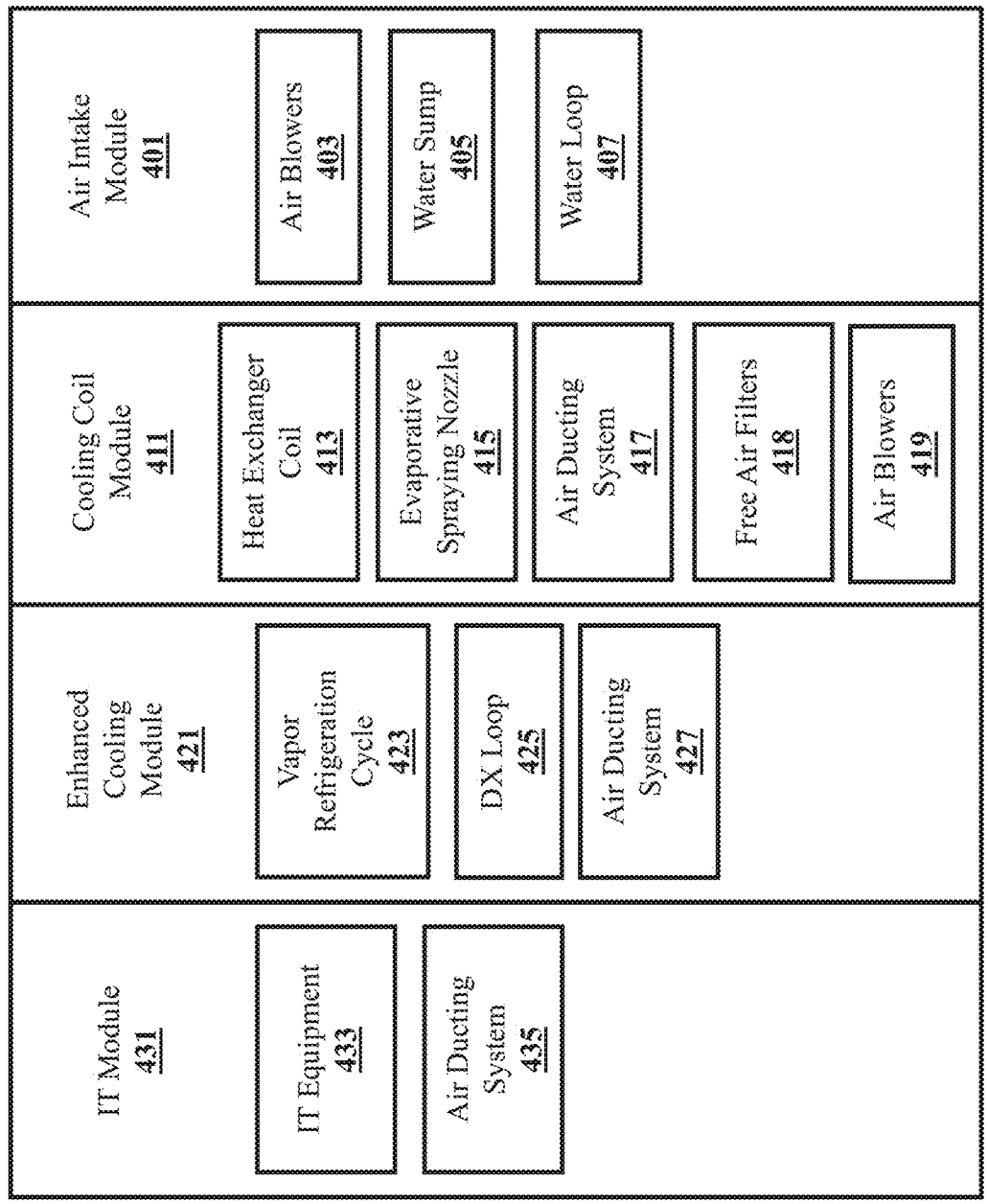
FIG. 4 shows a modular block diagram of a multi-floor data center, according to an embodiment of the present disclosure.

FIG. 4 shows a modular block diagram of a multi-floor data center, according to an embodiment of the present disclosure. In this example embodiment, the multi-floor data center includes a number of modules, including the air intake module 401, cooling coil module 411, enhanced cooling module 421, and IT module 431. In some embodiments, these modules can be developed in parallel, which may significantly improve construction efficiency. These four modules can be considered part of the building infrastructure, in some embodiments. For example, the air intake module can be fully considered as part of the building infrastructure, and it can include a centralized air source with air blowers 403, a centralized liquid sump 405, and a centralized liquid loop, in some embodiments.

The cooling coil module 411 can include, for example, a heat exchanger coil 413. The heat exchanger coil 413 can be part of a cooling unit module, in some embodiments, which can be decoupled from the building infrastructure and replaced or serviced independently. In some embodiments, the building design incorporates both building infrastructure components and more independent cooling units. Some of the functions may be designed in a centralized manner, while other functions may be designed in a more distributed manner. In some embodiments, the cooling coil module 411 may also include an evaporative spraying nozzle 415, an air ducting system 417, fee air filters 418, and air blowers 419.

The enhanced cooling module 421 can include, for example, a vapor refrigeration cycle 423, a DX loop 425, and an air ducting system 427. In some embodiments, the IT module can include IT racks or IT equipment 433, as well as an air ducting system 435. One skilled in the art will appreciate that each of the modules can include more or fewer components, and that some components can be consolidated or connected across different modules (e.g., the air ducting systems 417, 427, 435 may be connected or in fluid communication with each other, in some embodiments.

The various components and systems for each of the individual modules can be adjusted, replaced, or serviced based on needs. For example, the liquid loop 407 and blowers 403 of the air intake module 401 can be upgraded if the entire building needs more cooling air flow. As another example, the individual cooling heat exchanger coil 413 and DX loop 425 can be upgraded for certain IT rooms or certain floors to increase cooling. Such a design provides increased design possibilities and allows for dynamic system adjustments for different use cases over the lifetime of the data center.

Figure 5:
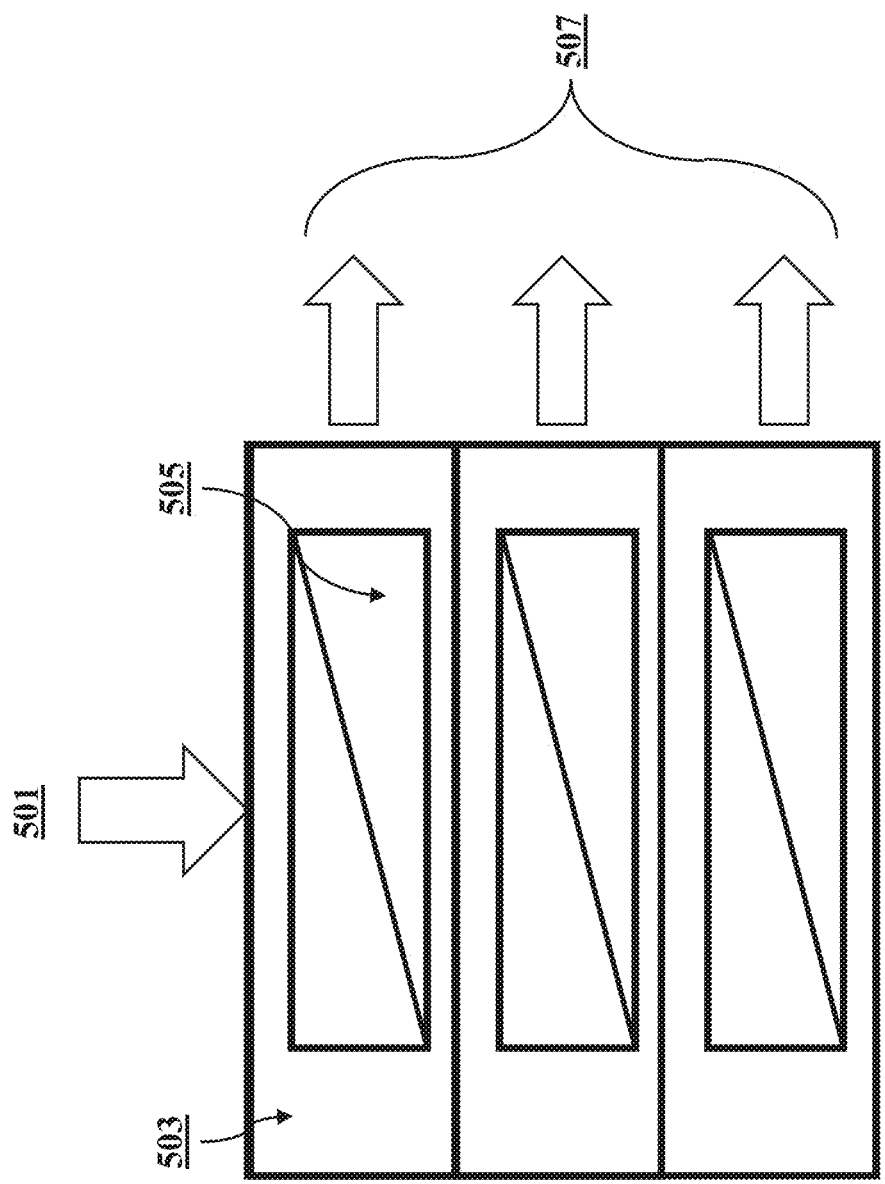
FIG. 5 illustrates an example of an external air flow management system, according to an embodiment of the present disclosure.

FIG. 5 illustrates an example of an external air flow management system, according to an embodiment of the present disclosure. In some embodiments, in order to implement the cooling system for a multi-floor building, the air inlet and air outlet are fully separate. In this example embodiment, a centralized outside air inlet 501 is introduced into the cooling coil module 503 which houses the heat exchanger coils 505. The exhaust 507 exits the data center building in this example embodiment. In this design, the impact of the air inlet and outlet of each exchanger coil 505 at the same or different floors can be minimized. In order to achieve the desired air flow paths shown in FIG. 5, an air ducting system is designed and implemented. An example illustration of such an air ducting system is described in more detail below in reference to FIG. 6.

Figure 6:
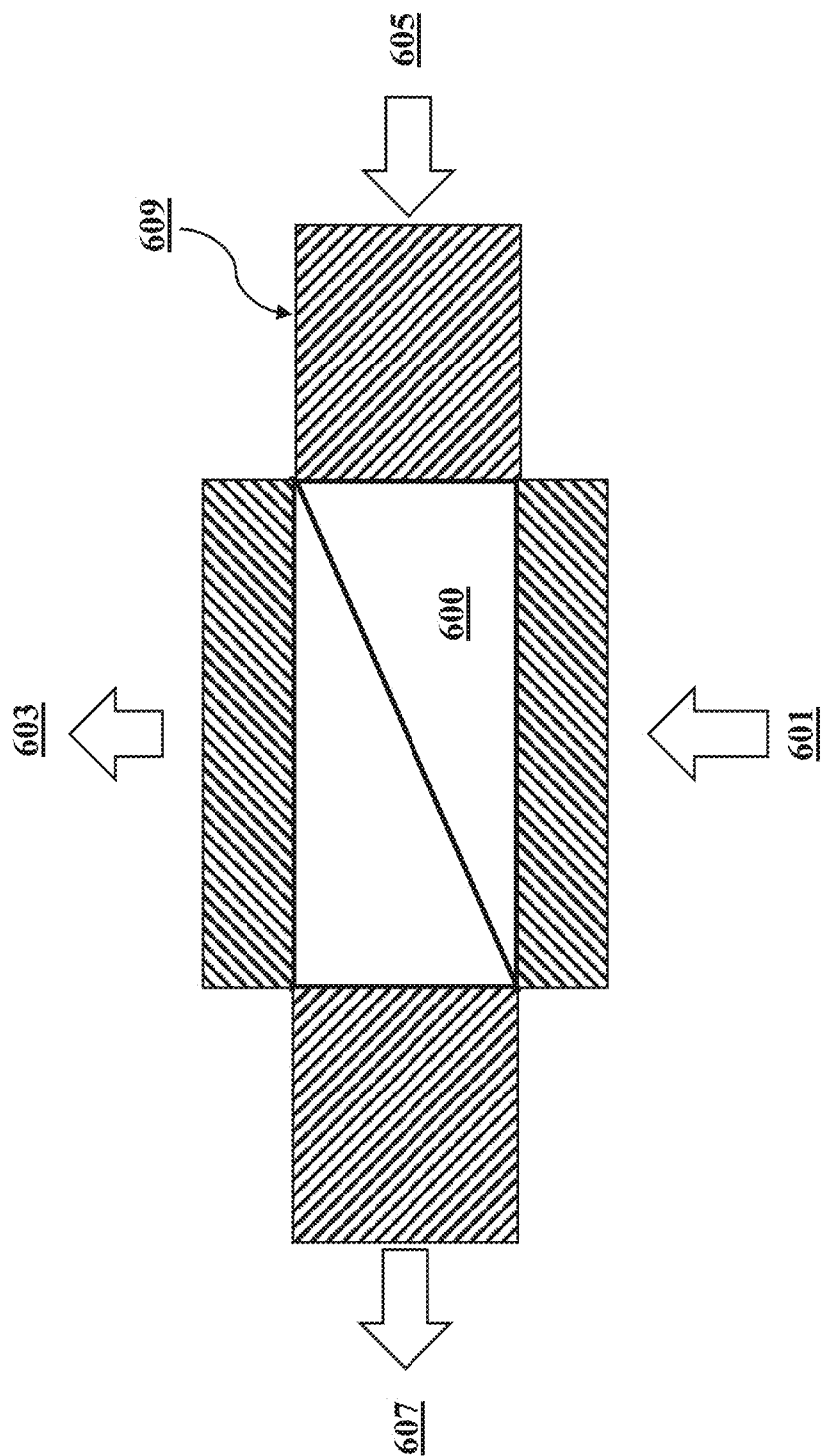
FIG. 6 illustrates an example ducting system for a cooling coil, according to an embodiment of the present disclosure.

FIG. 6 illustrates an example ducting system 609 for a cooling coil, according to an embodiment of the present disclosure. This example illustrates a simplified representation of an air ducting system 609, since a detailed air ducting system is designed based on the specific needs of individual applications. However, the major components and functions of an example air ducting system can include two separate air loops, including a data center air loop and an external air loop. The data center air loop (shown as the horizontal arrows in FIG. 6) can supply cooled air 607 to the IT module from the cooling coil 600. As mentioned above, a bypass system can be used to circumvent an enhanced cooling module, in some embodiments. The data center air-return ducting system 605 can recirculate the air from the IT module back to the cooling coil 600. In this example embodiment, an external air loop (shown as the vertical arrows 601 to 603 in FIG. 6) can create an air path to direct fresh air 601 from an air intake module to the cooling coil 600 in order to cool off the coil 600. The external air exhaust 603 expels the air exhaust from the building once it has passed through the cooling coil module to cool the coil 600, in this embodiment.

One skilled in the art would recognize that various adjustments can be made to the system within the scope of this disclosure. In some embodiments, the air intake and exhaust systems can be different based on the building infrastructure, and various bypass ducts or louvers can be incorporated. An enhanced cooling loop can incorporate either a direct refrigeration compression loop, or a thermosiphon cooling loop with an additional phase change cooling unit, in some embodiments. Additional cooling infrastructure can be added, in some embodiments, such as a liquid cooling infrastructure. Different airflow management designs can be implemented, such as airflow path designs using air ducting systems and/or air louvers for both data center internal air and external air may be applicable.

The following clauses and/or examples pertain to specific embodiments or examples thereof. Specifics in the examples may be used anywhere in one or more embodiments. The various features of the different embodiments or examples may be variously combined with some features included and others excluded to suit a variety of different applications. Examples may include subject matter such as a method, means for performing acts of the method, at least one machine-readable medium including instructions that, when performed by a machine cause the machine to performs acts of the method, or of an apparatus or system according to embodiments and examples described herein. Various components can be a means for performing the operations or functions described.

One embodiment provides for a multi-floor data center including a data center building having a number of floors; a single air intake module spanning each of the floors and configured to receive external air into the data center building; a number of cooling coil modules configured to receive the external air from the single air intake module to cool a cooling coil; a centralized liquid cooling system configured to pump liquid to the cooling coil for each of the cooling coil modules; and a number of IT modules. Each of the floors includes one of the IT modules configured to house a number of computing systems. The internal air is cooled at each of the cooling coil modules and introduced into each of the IT modules. In some embodiments, the data center also includes an enhanced cooling module located on at least one of the floors and configured to further cool the internal air. In some embodiments, the enhanced cooling module includes an evaporator coil configured to cool the internal air. In some embodiments, the data center also includes an external cooling unit in communication with the enhanced cooling module. In some embodiments, the data center also includes a number of return air ducts, wherein each of the floors includes one of the return air ducts configured to direct the internal air from one of the IT modules to a corresponding cooling coil module. In some embodiments, the data center also includes an enhanced cooling module located on at least one of the floors; and a return air duct configured to allow air to bypasses the enhanced cooling module between one of the cooling coil modules and one of the IT modules. In some embodiments, each of the IT modules is configured to house between 20-30 computing system racks. In some embodiments, the IT modules are configured to house between 80-100 computing system racks in total.

Another embodiment provides for a multi-floor data center including a data center building having a plurality of floors; a single air intake module spanning each of the plurality of floors and configured to receive external air into the data center building; a plurality of air cooling modules; and a plurality of IT modules. Each of the air cooling modules is configured to house either a cooling coil configured to receive external air from the single air intake module and connected to a centralized liquid cooling system; or a direct free air filter configured to filter air from the single air intake module. Air from each of the air cooling modules is introduced into each of the plurality of IT modules. In some embodiments, the data center also includes an enhanced cooling module located on at least one of the plurality of floors. In some embodiments, the enhanced cooling module includes an evaporator coil. In some embodiments, the data center also includes at least one return air duct configured to circulate internal air from one of the plurality of IT modules to the cooling coils within the plurality of air cooling modules. In some embodiments, the air cooling modules house a cooling coil or direct free air filter based on a type of computing system housed within the plurality of IT modules. In some embodiments, the air cooling modules house a cooling coil or direct free air filter based on external air quality. In some embodiments, each of the IT modules is configured to house between 20-30 computing system racks. In some embodiments, the IT modules are configured to house between 80-100 computing system racks in total.

Another embodiment provides for a multi-floor data center including a data center building having a number of floors, and a single air intake module spanning each of the floors and configured to receive external air into the data center building through a side wall of the data center building. The data center also includes a number of cooling coil modules, and each of the floors includes at least one of the cooling coil modules configured to receive the external air from the single air intake module to cool a cooling coil. The data center also includes a number of enhanced cooling modules, and each of the floors includes at least one of the enhanced cooling modules configured to further cool internal air. The data center also includes an external cooling unit in communication with the enhanced cooling modules. The data center also includes a centralized liquid cooling system, a number of IT modules, and a number of return air ducts. The centralized liquid cooling system is configured to pump liquid to the cooling coil for each of the cooling coil modules and to the external cooling unit, and any other system or component which may need a liquid supply. Each of the floors includes one of the IT modules configured to house computing systems, and internal air is cooled at each of the cooling coil modules and enhanced cooling modules before being introduced into each of the IT modules. Each of the floors includes one of the return air ducts configured to direct the internal air from one of the IT modules to a corresponding cooling coil module. In some embodiments, the data center also includes a number of return air ducts configured to allow air to bypass the enhanced cooling modules between the cooling coil modules and the IT modules. In some embodiments, each of the IT modules is configured to house between 20-30 computing system racks. In some embodiments, the IT modules are configured to house between 80-100 computing system racks in total.

In the foregoing specification, the invention has been described with reference to specific embodiments thereof. However, various modifications and changes can be made thereto without departing from the broader spirit and scope of the invention. The specification and drawings are, accordingly, to be regarded in an illustrative rather than a restrictive sense.

What is claimed is:

1. A multi-floor data center comprising:
   a data center building having a plurality of floors;
   a single air intake module spanning each of the plurality of floors and configured to receive external air into the data center building;
   a plurality of cooling coil modules, wherein each of the plurality of floors includes at least one of the plurality of cooling coil modules configured to receive the external air from the single air intake module to cool a cooling coil;
   a centralized liquid cooling system configured to circulate cooling liquid to the cooling coil for each of the plurality of cooling coil modules; and
   a plurality of IT modules, wherein each of the plurality of floors includes one of the IT modules configured to house a plurality of computing systems, wherein internal air is cooled at each of the plurality of cooling coil modules and introduced into each of the plurality of IT modules.

2. The multi-floor data center as in claim 1, further comprising an enhanced cooling module located on at least one of the plurality of floors and configured to further cool the internal air.

3. The multi-floor data center as in claim 2, wherein the enhanced cooling module includes an evaporator coil configured to cool the internal air.

4. The multi-floor data center as in claim 3, further comprising an external cooling unit in communication with the enhanced cooling module.

5. The multi-floor data center as in claim 1, further comprising a plurality of return air ducts, wherein each of the plurality of floors includes one of the plurality of return air ducts configured to direct the internal air from one of the IT modules to a corresponding cooling coil module.

6. The multi-floor data center as in claim 1, further comprising:
   an enhanced cooling module located on at least one of the plurality of floors; and
   a return air duct configured to allow air to bypasses the enhanced cooling module between one of the cooling coil modules and one of the IT modules.

7. The multi-floor data center as in claim 1, wherein each of the plurality of IT modules is configured to house between 20-30 computing system racks, and the plurality of IT modules is configured to house between 80-100, 100-200, 200-300, 300-400, or 400-500 racks in total.

8. The multi-floor data center as in claim 1, wherein at least one of the plurality of IT modules is configured to house other equipment such as Uninterruptible Power Supply (UPS) battery modules.

9. A multi-floor data center, comprising:
   a data center building having a plurality of floors;
   a single air intake module spanning each of the plurality of floors and configured to receive external air into the data center building;
   a plurality of air cooling modules, wherein each of the plurality of floors includes at least one of the plurality of air cooling modules, and each of the plurality of air cooling modules is configured to house:
     a cooling coil configured to receive external air from the single air intake module and connected to a centralized liquid cooling system; or
     a direct free air filter configured to filter air from the single air intake module; and
   a plurality of IT modules, wherein each of the plurality of floors includes one of the IT modules configured to house a plurality of computing systems, wherein air from each of the plurality of air cooling modules is introduced into each of the plurality of IT modules.

10. The multi-floor data center as in claim 9, further comprising:
    an enhanced cooling module located on at least one of the plurality of floors.

11. The multi-floor data center as in claim 10, wherein the enhanced cooling module includes an evaporator coil.

12. The multi-floor data center as in claim 9, further comprising:
    at least one return air duct configured to circulate internal air from one of the plurality of IT modules to the cooling coils within the plurality of air cooling modules.

13. The multi-floor data center as in claim 9, wherein the plurality of air cooling modules house a cooling coil or direct free air filter based on a type of computing system housed within the plurality of IT modules.

14. The multi-floor data center as in claim 9, wherein the plurality of air cooling modules house a cooling coil or direct free air filter based on external air quality.

15. The multi-floor data center as in claim 9, wherein each of the plurality of IT modules is configured to house between 20-30 computing system racks, and the plurality of IT modules is configured to house between 80-100, 100-200, 200-300, 300-400, or 400-500 racks in total.

16. The multi-floor data center as in claim 9, wherein at least one of the plurality of IT modules is configured to house other equipment such as Uninterruptible Power Supply (UPS) battery modules.

17. A multi-floor data center comprising:
    a data center building having a plurality of floors;
    a single air intake module spanning each of the plurality of floors and configured to receive external air into the data center building through a side wall of the data center building;
    a plurality of cooling coil modules, wherein each of the plurality of floors includes at least one of the plurality of cooling coil modules configured to receive the external air from the single air intake module to cool a cooling coil;

a plurality of enhanced cooling modules, wherein each of the plurality of floors includes at least one of the plurality of enhanced cooling modules configured to further cool internal air;

an external cooling unit in communication with the plurality of enhanced cooling modules;

a centralized liquid cooling system configured to circulate cooling liquid to the cooling coil for each of the plurality of cooling coil modules and to the external cooling unit;

a plurality of IT modules, wherein each of the plurality of floors includes one of the IT modules configured to house a plurality of computing systems, wherein internal air is cooled at each of the plurality of cooling coil modules and enhanced cooling modules before being introduced into each of the plurality of IT modules; and a plurality of return air ducts, wherein each of the plurality of floors includes one of the plurality of return air ducts configured to direct the internal air from one of the IT modules to a corresponding cooling coil module.

18. The multi-floor data center as in claim 17, further comprising:

a plurality of return air ducts configured to allow air to bypass the plurality of enhanced cooling modules between the plurality of cooling coil modules and the plurality of IT modules.

19. The multi-floor data center as in claim 17, wherein each of the plurality of IT modules is configured to house between 20-30 computing system racks, and the plurality of IT modules is configured to house between 80-100, 100-200, 200-300, 300-400, or 400-500 racks in total.

20. The multi-floor data center as in claim 17, wherein at least one of the plurality of IT modules is configured to house other equipment such as Uninterruptible Power Supply (UPS) battery modules.

\* \* \* \* \*